ns Patent [19]

Grisik

[11] 4,029,477
[45] June 14, 1977

[54] COATED NI-CR BASE DISPERSION-MODIFIED ALLOY ARTICLE
[75] Inventor: John J. Grisik, Middletown, Ohio
[73] Assignee: General Electric Company, Cincinnati, Ohio
[22] Filed: Oct. 29, 1975
[21] Appl. No.: 626,653
[52] U.S. Cl. .................................. 428/680; 75/171
[51] Int. Cl.² ......................................... B32B 15/00
[58] Field of Search ........................ 29/194; 75/171

[56] References Cited
UNITED STATES PATENTS

| | | | |
|---|---|---|---|
| 3,290,126 | 12/1966 | Monson | 29/194 |
| 3,649,225 | 3/1972 | Simmons | 29/194 |
| 3,754,903 | 8/1973 | Goward et al. | 75/171 |
| 3,764,371 | 10/1973 | Baldi | 29/194 X |
| 3,785,854 | 1/1974 | Baldi | 29/194 X |
| 3,869,779 | 3/1975 | Gedwill et al. | 29/194 |
| 3,918,139 | 11/1975 | Felten | 29/194 |
| 3,928,026 | 12/1975 | Hecht et al. | 29/194 X |

*Primary Examiner*—L. Dewayne Rutledge
*Assistant Examiner*—E. L. Weise
*Attorney, Agent, or Firm*—Lee H. Sachs; Lawrence Derek P.

[57] ABSTRACT

An article of improved oxidation resistance includes a metal base of a NiCr dispersion-modified alloy including, by weight, 15 – 30% Cr, 0.1 – 10% of oxides selected from oxides of the rare earth elements, particularly Th, Y and La, up to 1% of elements selected from Ti and Al, with the balance Ni and incidental impurities. To the base is applied a coating consisting essentially of, by weight, about 8 to less than about 14% Al, about 15 – 30% Cr, about 0.01 – 10% of elements selected from Y and Hf, with the balance essentially nickel and incidental impurities.

4 Claims, No Drawings

COATED NI-CR BASE DISPERSION-MODIFIED ALLOY ARTICLE

BACKGROUND OF THE INVENTION

This invention relates to coated nickel-base alloys and, more particularly, to coated dispersion-modified, nickel-base alloys including Cr for improved high temperature oxidation resistance.

The invention herein described was made in the course of or under a contract, or a subcontract thereunder, with the United States Department of the Air Force.

The commercial availability of dispersion-modified or dispersion-strengthened nickel-base alloys provided an additional family of materials for high temperature applications. Such alloys consist essentially of Ni or Ni and Cr with a relatively small amount of an oxide such as of Th, Y or La dispersed through the alloy for strengthening purposes. The ability of this type of alloy to retain much of its strength at relatively high temperatures made it attractive for certain applications including those in gas turbine engines. However, one problem which was experienced was the gross oxidation which occurred when it operated in the higher temperature areas of gas turbine engines.

A variety of coatings and coating methods have been described, typical of which is that shown in U.S. Patent 3,290,126 - Monson describing the generation of a chromizing layer which is subsequently aluminized. However, attempts to apply the duplex chromizing aluminizing coating produced voiding of the base material as well as providing limited oxidation protection.

SUMMARY OF THE INVENTION

It is a principal object of the present invention to provide a coated article based on a dispersion-modified NiCr base alloy, the coating portion of which provides oxidation resistance to the article and yet does not affect detrimentally the base material upon high temperature exposure.

This and other objects and advantages will be more fully understood from the following detailed description and the examples, all of which are intended to be representative of rather than in any way limiting on the scope of the present invention.

Briefly, the article of the present invention comprises a base of a dispersion-modified alloy predominantly of Ni and Cr as a major alloying element. Such alloy consists essentially of, by weight, 15 – 30% Cr, 0.1 – 10% of oxides selected from the rare earth element oxides, up to about 1% of elements selected from Ti and Al, with the balance essentially Ni and incidental impurities. A preferred form of the base includes Cr in the range of 18 – 23% and oxides selected from those of Th, Y and La in the range of about 0.4 – 3%. In the preferred form, when oxides of Th are selected, it is specifically preferred that they be in the range of about 1.5 – 3% and when oxides of Y are selected it is specifically preferred that they be in the range of about 0.4 – 2%.

The coating applied to the base, consists essentially of, by weight, 8% to less than about 14% Al, about 15 – 30% Cr, 0.01 – 10% of elements selected from Y and Hf, with the balance Ni and incidental impurities. A preferred form of the coating consists essentially of, by weight, about 8 – 12% Al, about 18 – 26% Cr, and 0.01 – 5% of elements selected from Y and Hf, with the balance Ni and incidental impurities.

DESCRIPTION OF THE PREFERRED EMBODIMENTS

Although several coating systems have been reported for use with dispersion-modified alloys, such known systems have not been fully metallurgically compatible with such alloys. The results of the incompatibility are void formation at the interface between the coating and the substrate. Required for a coating for the dispersion-modified NiCr-type alloys is a coating system which provides adequate oxidation protection without resulting in void formation at the interface between the coating and the substrate while at the same time adjusting the composition of the coating to inhibit diffusion into or out of the substrate to create an unbalance in the substrate material.

According to the present invention, there is provided a coated article, the coating portion of which includes a critical balance of Al and Cr for oxidation protection and interdiffusion control, along with such elements as Y and Hf for oxide scale stabilization. In respect to the Al content of the coating, it should be recognized that the oxide dispersion-strengthened substrate alloys to which the present invention particularly relates do not include the alloying elements normally present in the type of nickel-base, high temperature alloys generally referred to as superalloys. Therefore, although some deformation can be retained in the structure of the dispersion modified alloys, such as from working, not enough deformation is retained in preferred processing to result in recrystallization upon heating or exposure to high temperature operation. Recrystallization in properly processed material is only accomplished by chemical activation. One of the elements which is significant in bringing about such chemical activation is Al.

In the evaluation of the present invention, a variety of combinations of Cr, Al, Y and Ni were studied as a coating for a nickel-base alloy consisting nominally of about 20 weight percent Cr, and about 2 volume percent $ThO_2$, with the balance Ni and incidental impurities, hereinafter referred to as TDNiCr alloy.

Example 1

Test specimens of the TDNiCr alloy were coated to a thickness in the range of about 3 – 5 mils by vacuum vapor deposition of a coating consisting essentially of, by weight, 19.5% Cr, 7.6% Al, 0.05Y, with the balance Ni. The specimens were tested in dynamic oxidation for 500 hours at about 2000°F (about 1095°C) in a low velocity (Mach. 0.05) flow of air in a flame tunnel. During the test, specimens were cycled to about 900°F (about 480°C) six times per hour to induce a thermal shock and therefore promote spalling of the coating and protective oxide formed during testing. Prior to testing, the specimens were heat treated at 2000°F (1095°C) for two hours in hydrogen.

After testing, photomicrographic studies disclosed evidence of some frontal attack, with the formation of $Cr_2O_3$ formed by interal oxidation due to diffusion of oxygen into and through the coating. Microprobe analysis of the coating after testing showed a nominal composition, by weight, at 18% Cr, 0.5 – 1% Al and 80% Ni with less than about 0.1% Y. The microstructure and probe analysis indicated that the Al level of the coating which resulted from the inclusion of 7.6 weight percent Al initially had, during testing, dropped below that necessary to form a protective $Al_2O_3$ layer.

Example 2

The specimen preparation and test described in Example 1 was repeated using a coating consisting essentially of, by weight, 23.8% Cr, 8.4% Al, 0.1Y, with the balance essentially Ni and incidental impurities. After 674 hours of the above-described dynamic oxidation test, the microprobe analysis of the coating showed its composition to be, nominally by weight, 19% Cr, 4% Al and 77% Ni with less than about 0.03% Y. After 1020 hours of such test, the nominal composition was, by weight, 17% Cr, 2% Al and 79% Ni and Y at about 0.01% or less. Photomicrographic studies, for example after 674 hours, showed only slight frontal attack with no significant voiding or phase formation at the coating/substrate interface or in the TDNiCr substrate itself. After 1020 hours of exposure, the coating was still protective to the substrate.

From a comparison of Examples 1 and 2, the present invention, as it relates to the Al content of the coating, discloses a critical minimum Al content at about 8 weight percent. Therefore, the coating of the present invention defines Al content as being at least about 8 weight percent.

Example 3

Confirming the data generated in connection with the criticality of the Al content were a series of evaluations of TDNiCr alloy specimens coated in Example 1 with coatings including Al in the range of about 10 – 12 weight percent. Typical of such coatings are those which consisted essentially of, by weight, 26% Cr, 10.6% Al, 0.09% Y with the balance essentially Ni and incidental impurities and a coating which consisted essentially of, by weight, 23.5% Cr, 11.5% Al, 0.09% Y with the balance Ni and incidental impurities. Prior to esting, some specimens were heat treated for 2 hours at 2000° F (1095° C) while others were heat treated at the temperature for 500 hours in static air to determine the effect on stress rupture properties of diffusion from the coating into the substrate. The resulting data from oxidation and stress rupture indicated that the coating and exposure do not significantly affect the stress rupture properties of the TDNiCr alloy while at the same time provide good oxidation and sulfidation resistance.

Example 4

The specimen preparation and test of Example 1 was repeated with a coating which consisted essentially of, by weight, 18.2% Cr, 14.6% Al, 0.5% Y with the balance Ni and incidental impurities. Metallographic examination after testing showed spallation of the coating and voids at the interface between the coating and the substrate because of the increased amount of aluminum initially in the coating. Thus, the present invention recognizes that in respect to Al in a coating for TDNiCr type alloy, as high as about 14% Al is detrimental. Therefore, from the data represented by these examples, the present invention recognizes the critical range of from about 8 to less than about 14% Al and preferably 8 – 12% in such a coating for the protection of a dispersion-modified NiCr-type alloy. In addition, the data indicates the preferred range for Cr of 18 – 26% in the coating.

As has been stated, an improved coating for the dispersion-modified NiCr-type alloys should not upset the balance of Cr and Ni in the substrate. An important feature of the present invention is that it recognizes that the difference between the Cr content in the coating and the Cr content in the substrate should be no greater than about 10 weight percent and preferably no greater than about 5 weight percent in order to inhibit the diffusion of the Cr from the coating into the base or the diffusion of Cr from the base into the coating. Such diffusion of Cr from the coating decreases the oxidation resistance of the coating whereas the diffusion of Cr from the base upsets the phase stability in the dispersion-modified NiCr-type alloy.

In respect to the Cr content of the coating, it has been recognized that less than about 15 weight percent Cr results in insufficient corrosion resistance and resistance to sulfidation. In addition, it has been determined that greater than about 30 weight percent Cr in the coating creates a tendency or a significant gradient for the Cr to diffuse into the substrate.

As has been mentioned above, the inclusion of elements selected from Y and Hf in the coating of the present invention is for mechanical and chemical stabilization of the scale which forms during high temperature exposure in an oxidizing atmosphere. It has been found that less than about 0.01% of such elements provides insufficient stabilization, whereas greater than about 5% will tend to cause the coating alloy to oxidize rapidly at the grain boundaries where Hf or Y rich phases precipitate. For example, the solubilities of Y and Hf in the coating alloy are, by weight, about 0.5 and 1%, respectively. Below these levels but above 0.01%, the Hf or Y become a part of the protective aluminum oxide scale. In this role, they tend to chemically stabilize the protective scale and improve its effectiveness by acting as vacancy sites, thus reducing oxygen diffusion through the scale. At higher concentrations, in addition to becoming part of the scale, precipitation of Y or Hf rich phases at the grain boundaries occurs. In small quantities, these phases can be beneficial: near the surface, they oxidize and become an integral part of the protective oxide scale as oxide pegs into the coating alloy grain boundaries. These pegs act to anchor the protective scale, mechanically stabilizing it to resist stress imposed by thermal and mechanical cycling. At Y and Hf concentrations greater than about 5%, the volume of phases precipitated at the grain boundaries becomes large and the oxide pegs can extend appreciable distances into the coating. This can be deleterious since the stress imposed by the formation of large pegs can strain the coating and allow a path for more rapid oxidation of the coating. Y or Hf concentrations greater than about 10% result in such voluminous phase precipitation as to render the coating essentially non-protective.

Thus, the present invention provides an article having a base or substrate of a dispersion-modified NiCr alloy in which Cr is included in the range of about 15 – 30% along with the Ni base and in which there is a dispersion of 0.1 – 10% of oxides of the rare earth elements, preferably oxides selected from those of Th, Y and La. Optionally, there can be included in the base up to about 1% of elements selected from Ti and Al, the balance of the base being Ni and incidental impurities. When Th is selected from the rare earth elements, it is preferred that its oxide $ThO_2$ be in the range of about 1.5 – 3 weight percent and when Y is selected, it is preferred that its oxide $Y_2O_3$ be in the range of about 0.4 – 2 weight percent because certain minimum amounts of dispersed oxides are required to affect the high temperature strength and thermal stability attributes of the dispersion-strengthened materials. The upper limit in amounts of dispersed oxides is determined by a maximum above which the materials become resistant to the primary process recrystallization necessary to achieve desired microstructures and properties. The specific minimums and maximums of oxide content depend on many factors in the specific alloys. The coating associated with the article of the present invention consists essentially of, by weight, about 8 to less than about 14% $A_1$, about 15 – 30% Cr, about 0.01 – 10% of elements selected from Y and Hf, with the balance essentially Ni and incidental impurities, it being further provided that the difference between the Cr content of the base and the Cr content of the coating be no greater than 10 weight percent and preferably no greater than about 5 weight percent.

Although the present invention has been described in connection with specific typical examples, it will be recognized by those skilled in the art the modifications and variations of which the present invention is capable without departing from the scope intended to be defined by the appended claims.

What is claimed is:

1. A coated NiCr base dispersion-modified alloy article of improved resistance to oxidation and sulfidation comprising:
   a dispersion-modified base alloy consisting essentially of, by weight, 15 – 30% Cr, 0.01 – 10% of oxides selected from the group consisting of oxides of the rare earth elements, up to about 1% of elements selected from the group consisting of Ti and Al, with the balance Ni and incidental impurities; and
   a coating on the base alloy and consisting of, by weight, about 8 to less than about 14% Al, and 15 – 30% Cr, about 0.01 – 10% of elements selected from the group consisting of Y and Hf, with the balance Ni and incidental impurities;
   the difference between the Cr content of the base and Cr content of the coating being no greater than about 10 weight percent.

2. The article of claim 1 in which:
   the base consists essentially of, by weight, about 18 – 23% Cr, 0.4 – 3% of oxides selected from the group consisting of oxides of Th, Y and La, with the balance of Ni and incidental impurities; and
   the coating consists of, by weight, about 8 – 12% Al, 18 – 26Cr, 0.5 – 5% of elements selected from the group consisting of Y and Hf, with the balance Ni and incidental impurities;
   the difference between the Cr content in the coating and the Cr content in the base being no greater than about 5 weight percent.

3. The article of claim 2 in which the base, when oxides of Th are selected, includes $ThO_2$ in the range of about 1.5 – 3% and, when oxides of Y are selected, includes $Y_2O_3$ in the range of about 0.4 – 1%.

4. The article of claim 2 in which the coating consists of, by weight, about 8 – 12% Al, 18 – 26% Cr, 0.5 – 1% of elements selected from the group consisting of Y and Hf, with the balance Ni and incidental impurities.

* * * * *

UNITED STATES PATENT AND TRADEMARK OFFICE
CERTIFICATE OF CORRECTION

PATENT NO. : 4,029,477
DATED : June 14, 1977
INVENTOR(S) : John J. Grisik

It is certified that error appears in the above-identified patent and that said Letters Patent are hereby corrected as shown below:

Column 5, line 30, "0.01 - 10%" should read --0.1 - 10%--.

Column 6, line 5, before "15", delete [and] and insert --about--;

line 16, before "Ni", delete [of];

line 18, "18 - 26CR, 0.5 - 5%" should read --18 - 26% Cr, 0.05 - 5%--; and line 29, "0.5 - 1%" should read --0.05 - 1%--.

Signed and Sealed this

Fifteenth Day of November 1977

[SEAL]

Attest:

RUTH C. MASON
*Attesting Officer*

LUTRELLE F. PARKER
*Acting Commissioner of Patents and Trademarks*